United States Patent
Ching et al.

(10) Patent No.: US 9,520,498 B2
(45) Date of Patent: Dec. 13, 2016

(54) FINFET STRUCTURE AND METHOD FOR FABRICATING THE SAME

(71) Applicant: Taiwan Semiconductor Manufacturing Company, Ltd., Hsin-Chu (TW)

(72) Inventors: Kuo-Cheng Ching, Zhubei (TW); Guan-Lin Chen, Hsin-Chu (TW); Chao Hsiung Wang, Hsin-Chu (TW); Chi-Wen Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/216,535

(22) Filed: Mar. 17, 2014

(65) Prior Publication Data

US 2015/0263159 A1    Sep. 17, 2015

(51) Int. Cl.
*H01L 29/78* (2006.01)
*H01L 29/66* (2006.01)
*H01L 21/02* (2006.01)

(52) U.S. Cl.
CPC ....... *H01L 29/785* (2013.01); *H01L 29/66795* (2013.01); *H01L 21/0262* (2013.01);
(Continued)

(58) Field of Classification Search
CPC .. H01L 29/785; H01L 29/165; H01L 29/1608; H01L 29/66795
See application file for complete search history.

(56) References Cited

U.S. PATENT DOCUMENTS 6,359,311 B1    3/2002 Colinge et al.
2007/0257249 A1    11/2007 Mocuta et al.
(Continued)

FOREIGN PATENT DOCUMENTS

JP    2007300103 A    11/2007
JP    2009259865 A    11/2009
(Continued)

OTHER PUBLICATIONS

Gas, P., et al, "Diffusion of Sb, Ga, Ge, and (As) in TiSi2," Journal of Applied Physics, vol. 63, No. 11, Jun. 1, 1988, pp. 5335-5345.
(Continued)

*Primary Examiner* — Mark Prenty
(74) *Attorney, Agent, or Firm* — Slater Matsil, LLP

(57) ABSTRACT

A device comprises a substrate comprising silicon, a fin structure comprising a lower portion formed of silicon and enclosed by an isolation region, a middle portion formed of silicon-germanium-carbon, wherein the middle portion is enclosed by an oxide layer, an upper portion formed of silicon, wherein the upper portion comprises a channel and a silicon-carbon layer formed between the middle portion and the upper portion, a first source/drain region comprising a first silicon-phosphorus region and a first silicon-carbon layer formed underlying the first silicon-phosphorus region and a second source/drain region comprising a second silicon-phosphorus region and a second silicon-carbon layer formed underlying the second silicon-phosphorus region.

20 Claims, 18 Drawing Sheets

(52) U.S. Cl.
CPC .. *H01L 21/02529* (2013.01); *H01L 21/02532* (2013.01); *H01L 21/02579* (2013.01)

(56) References Cited

U.S. PATENT DOCUMENTS

| | | |
|---|---|---|
| 2009/0256208 A1 | 10/2009 | Okano |
| 2010/0140709 A1 | 6/2010 | Mouli |
| 2013/0092984 A1 | 4/2013 | Liu et al. |
| 2013/0234203 A1* | 9/2013 | Tsai .................. H01L 29/66795 257/190 |
| 2014/0048888 A1 | 2/2014 | Chen et al. |
| 2015/0228755 A1* | 8/2015 | Wei .................... H01L 29/6681 257/192 |

FOREIGN PATENT DOCUMENTS

| | | |
|---|---|---|
| KR | 20110085002 A | 7/2011 |
| KR | 20140023200 A | 2/2014 |

OTHER PUBLICATIONS

Tetelin, C., et al., "Kinetics and mechanism of low temperature atomic oxygen-assisted oxidation of SiGe layers," Journal of Applied Physics, vol. 83, No. 5, Mar. 1, 1998, pp. 2842-2846.

Wu et al., "Stacked 3-D Fin-CMOS Technology," IEEE Electron Device Letters, vol. 26, No. 6, Jun. 2005, pp. 416-418.

* cited by examiner

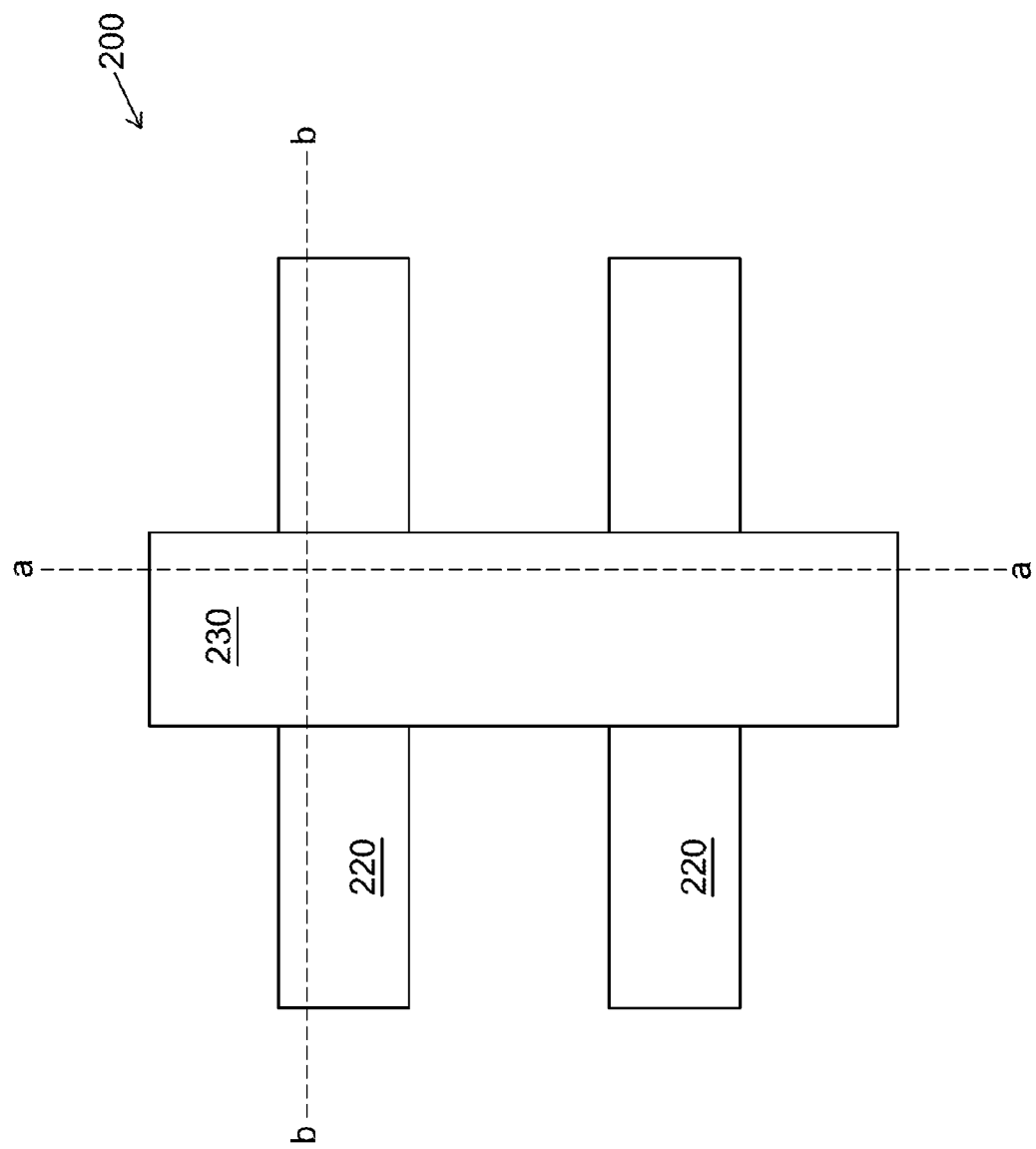

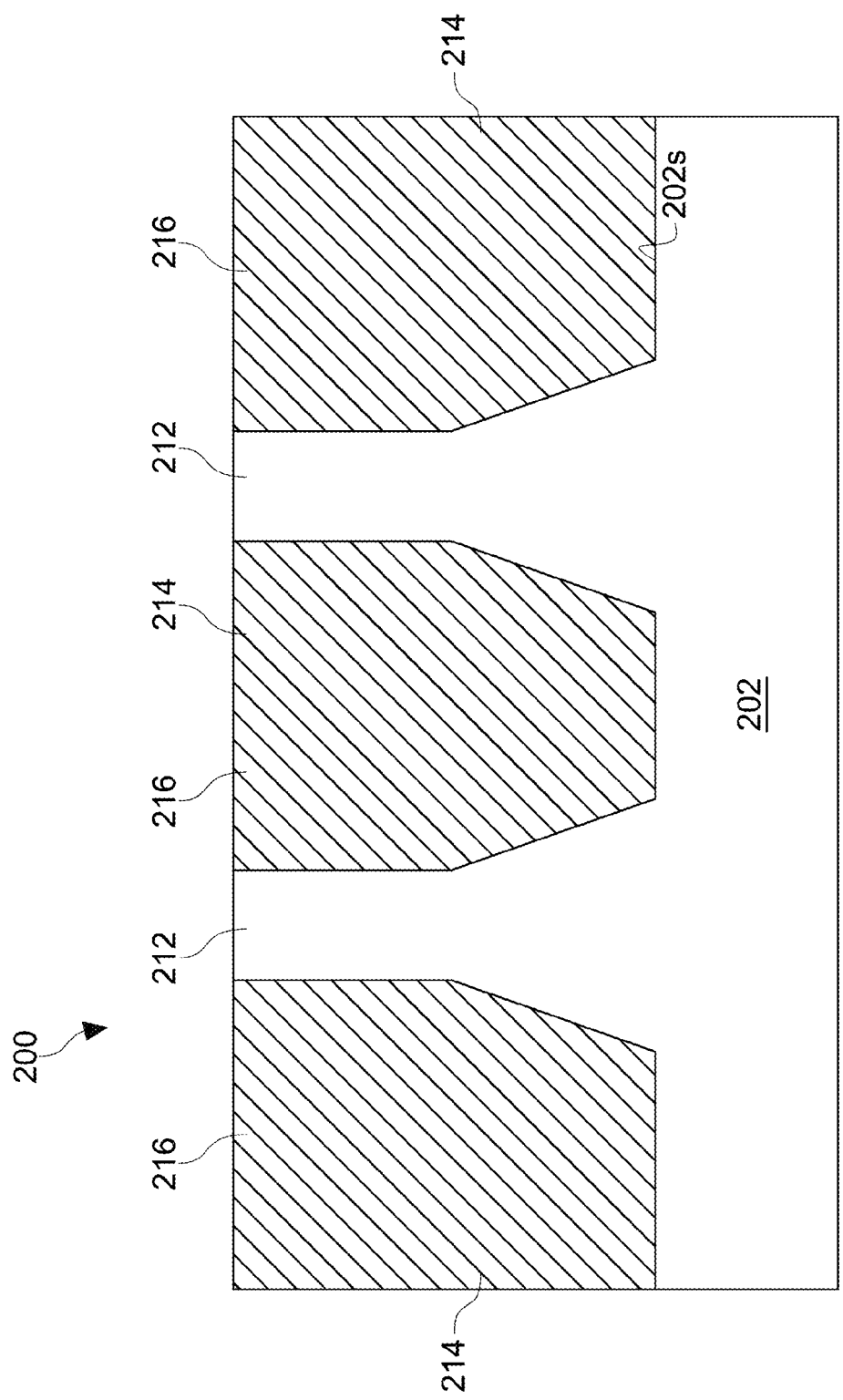

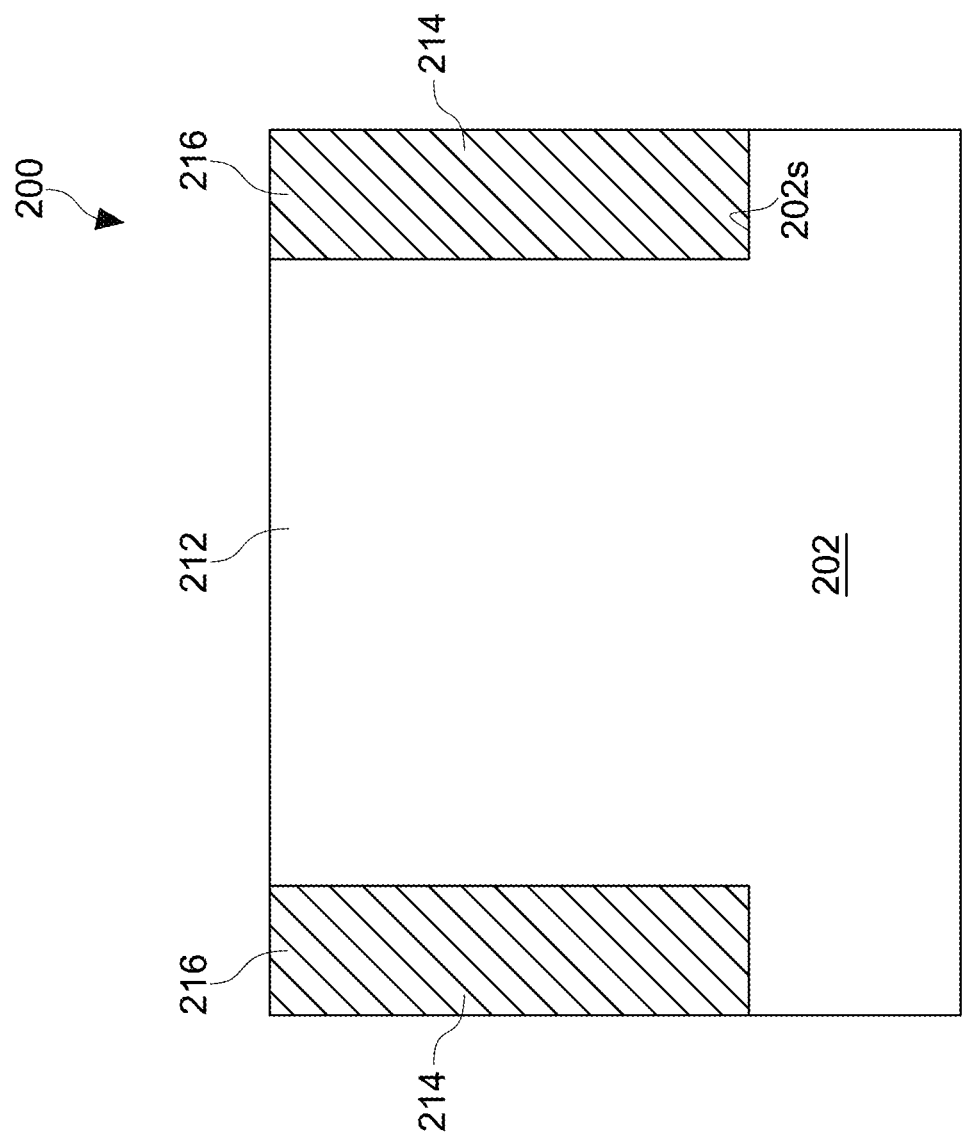

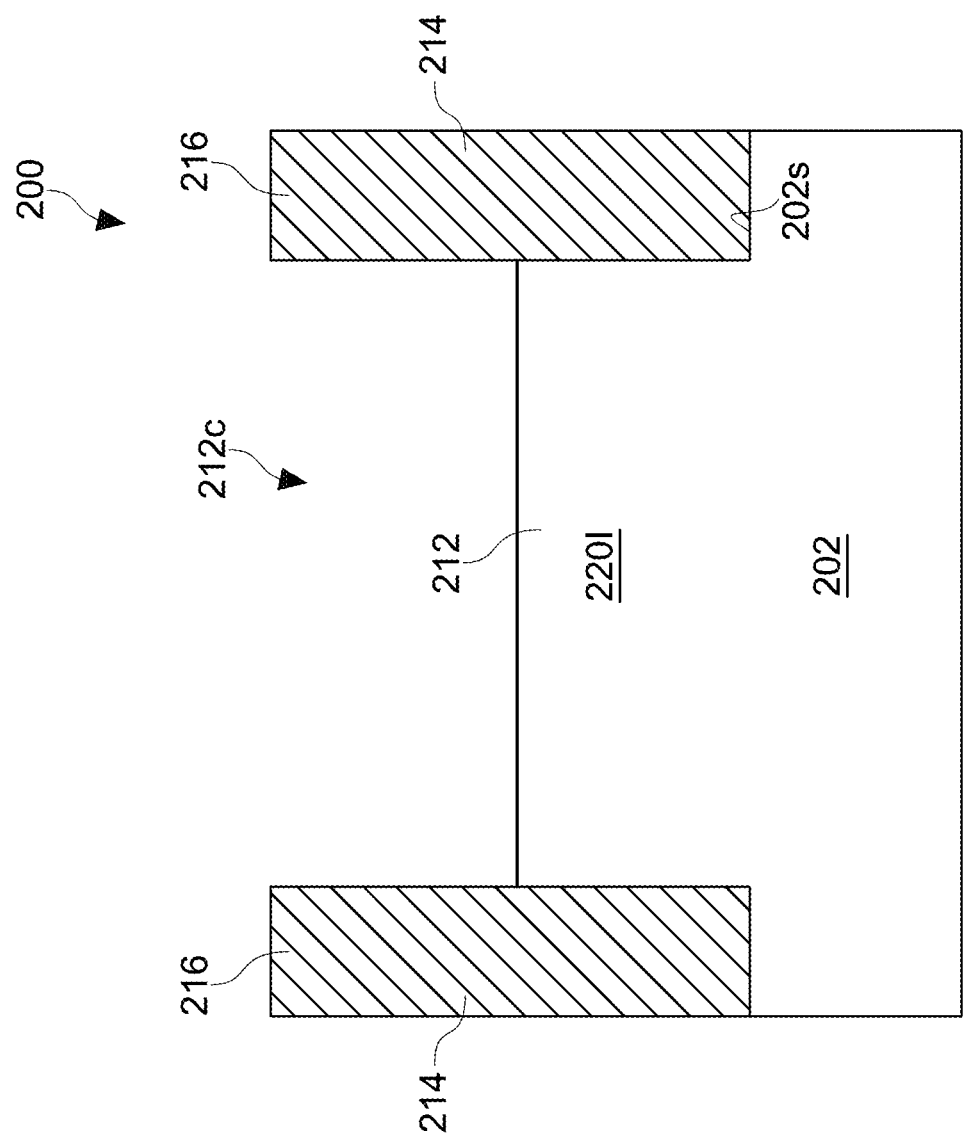

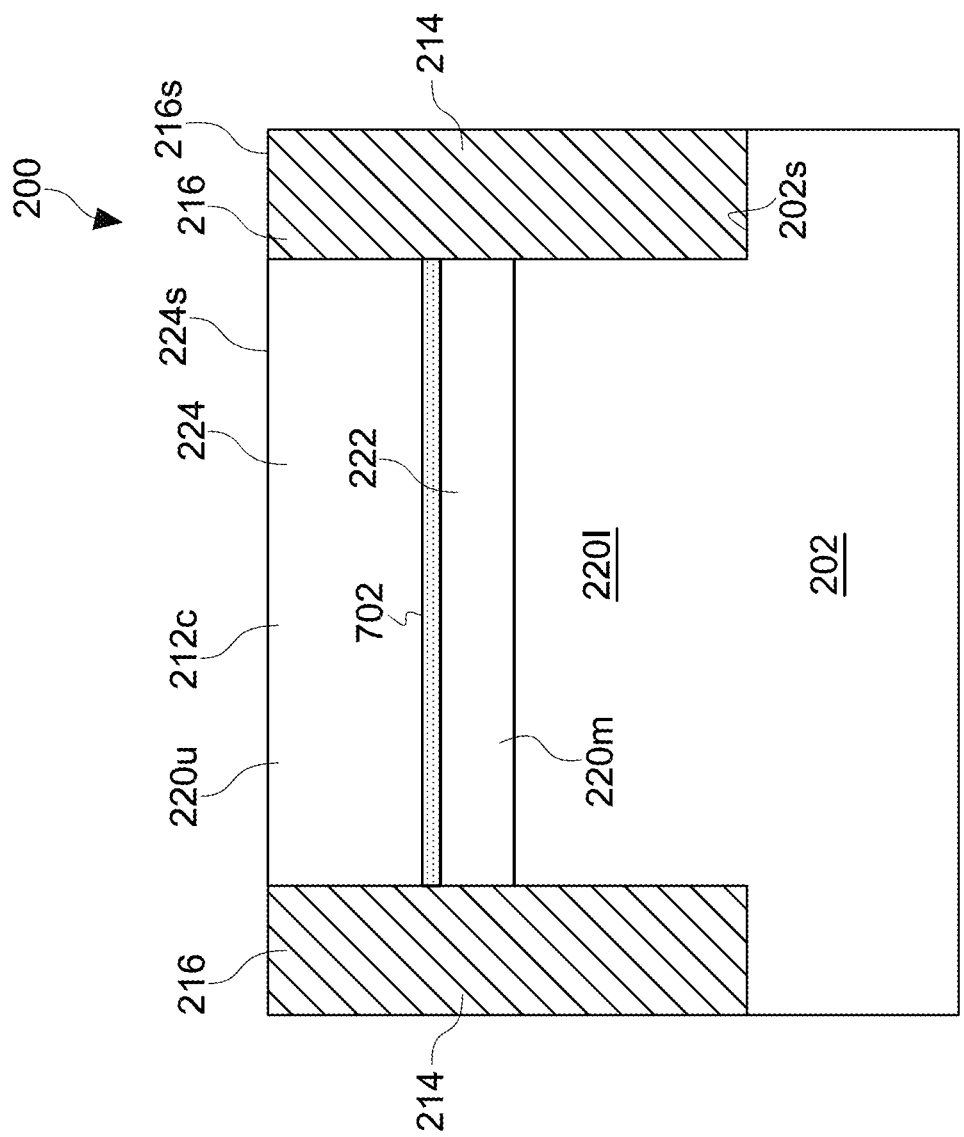

FINFET STRUCTURE AND METHOD FOR FABRICATING THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for even smaller electronic devices has grown recently, there has grown a need for reducing leakage current of semiconductor devices.

In a complementary metal oxide semiconductor (CMOS) field effect transistor (FET), active regions include a drain, a source, a channel region connected between the drain and the source, and a gate on top of the channel to control the on and off state of the channel region. When the gate voltage is more than a threshold voltage, a conductive channel is established between the drain and the source. As a result, electrons or holes are allowed to move between the drain and source. On the other hand, when the gate voltage is less than the threshold voltage, ideally, the channel is cut off and there are no electrons or holes flowing between the drain and the source. However, as semiconductor devices keep shrinking, due to the short channel leakage effect, the gate cannot fully control the channel region, especially the portion of the channel region which is far away from the gate. As a consequence, after semiconductor devices are scaled into deep sub-30 nanometer dimensions, the corresponding short gate length of conventional planar transistors may lead to the inability of the gate to substantially turn off the channel region.

As semiconductor technologies evolve, fin field effect transistors (FinFETs) have emerged as an effective alternative to further reduce leakage current in semiconductor devices. In a FinFET, an active region including the drain, the channel region and the source protrudes up from the surface of the semiconductor substrate upon which the FinFET is located. The active region of the FinFET, like a fin, is rectangular in shape from a cross section view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current.

The formation of fins of a FinFET may include recessing a substrate to form recesses, filling the recesses with a dielectric material, performing a chemical mechanical polish process to remove excess portions of the dielectric material above the fins, and recessing a top layer of the dielectric material, so that the remaining portions of the dielectric material in the recesses form shallow trench isolation (STI) regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a top view of a semiconductor device in accordance with various aspects of the present disclosure;

FIGS. 2A-8B are cross-sectional views of the semiconductor device shown in FIG. 1 at various stages of fabrication in accordance with various embodiment of the present disclosure;

DETAILED DESCRIPTION OF ILLUSTRATIVE EMBODIMENTS

Figure 2A:
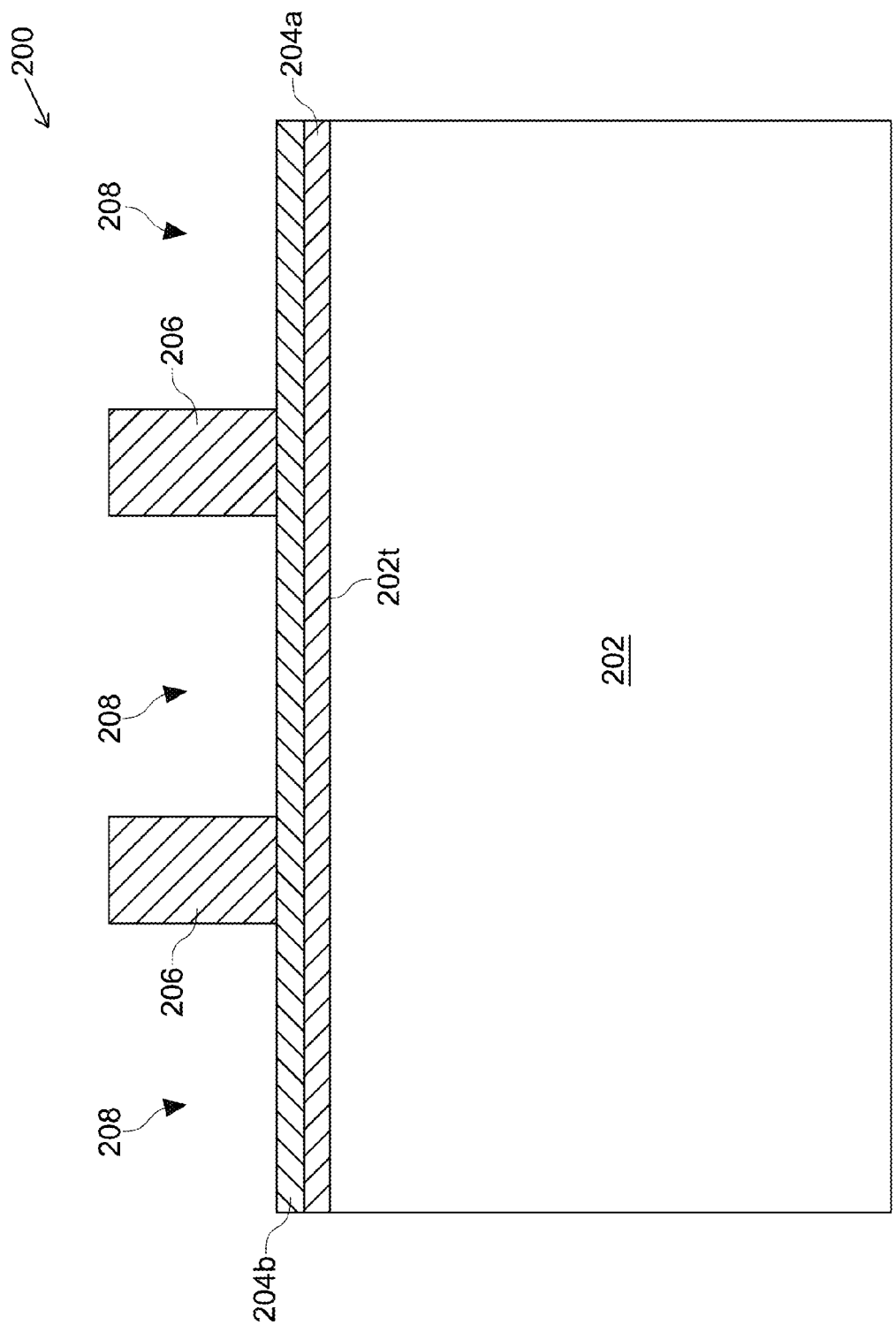

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a top view of a semiconductor device in accordance with various aspects of the present disclosure. In some embodiments, the semiconductor device 200 is a fin field effect transistor (FinFET). Throughout the description, the semiconductor device 200 is alternatively referred to as the FinFET 200. More particularly, the FinFET 200 refers to any fin-based, multi-gate transistors. Other transistor structures and analogous structures are within the contemplated scope of the disclosure. The FinFET 200 may be included in a microprocessor, memory cell, and/or other integrated circuit (IC).

The semiconductor device 200 comprises a fin structure 220, an isolation structure 218 surrounding the fin structure 220 and a gate structure 230 wrapping around channel portion of the fin structure 220. For illustration, the FinFET 200 comprises two fins. In some embodiments, the FinFET 200 may comprise less than or greater than two fins, for example, one fin or three fins.

FIGS. 2A-8B are cross-sectional views of the semiconductor device shown in FIG. 1 at various stages of fabrication in accordance with various embodiment of the present disclosure. Each figure (e.g., FIG. 2A) denoted with a letter "A" shows a cross-section view of the semiconductor device 200 taken along line a-a of FIG. 1. Each figure (e.g., FIG. 2B) denoted with a letter "B" shows a cross-section view of the semiconductor device 200 taken along line b-b of FIG. 1.

Figure 2B:
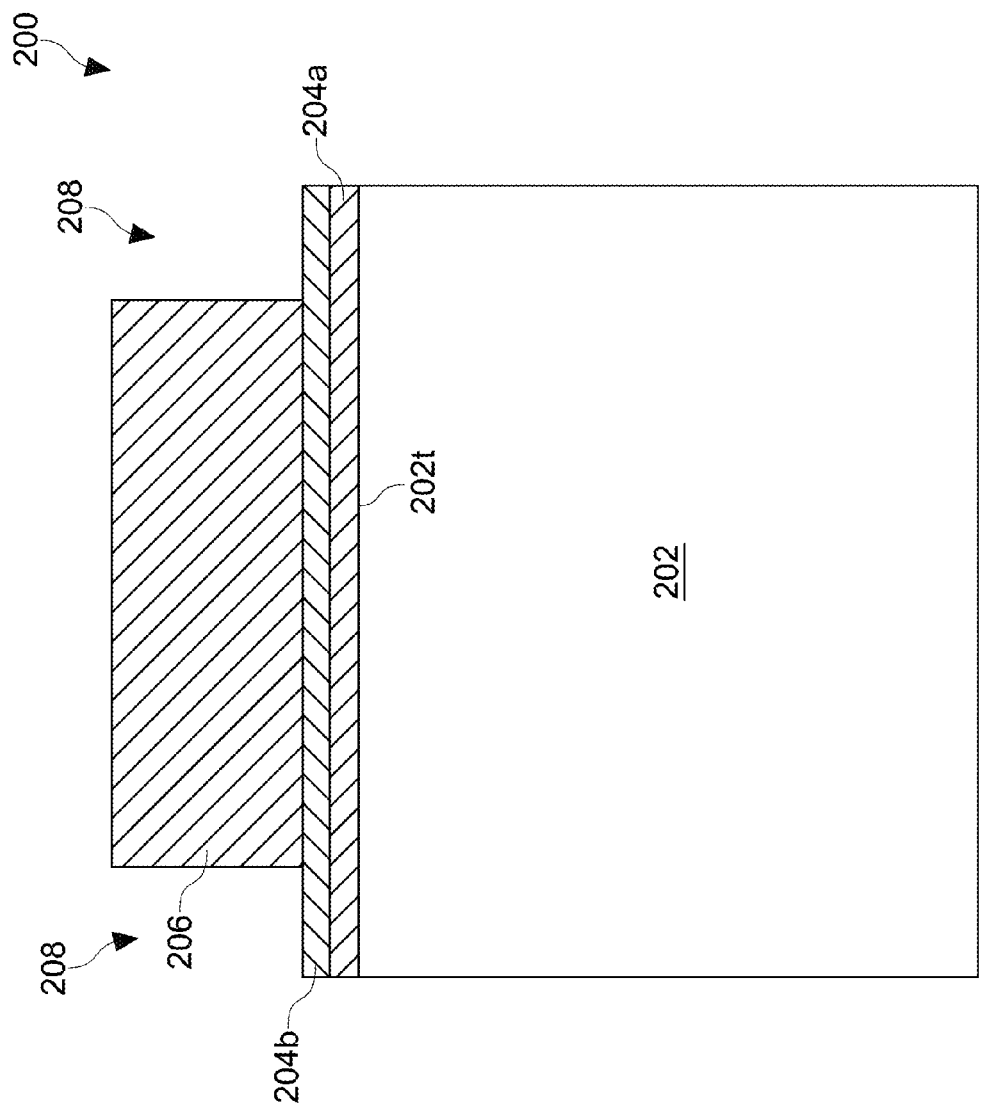

FIGS. 2A and 2B illustrate cross sectional views of a substrate of the semiconductor device shown in FIG. 1 in accordance with various aspects of the present disclosure. The substrate 202 comprises a first semiconductor material having a first lattice constant and hence is also referred to as first semiconductor material 202 in the present disclosure. In some embodiments, the substrate 202 comprises a crystalline silicon substrate (e.g., wafer). The substrate 202 may comprise various doped regions depending on design requirements (e.g., p-type substrate or n-type substrate).

In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some embodiments, the substrate 202 may be made of some other suitable elemental semiconductor, such as a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

In some embodiments, a pad layer 204a and a mask layer 204b may be formed on a top surface 202t of the semiconductor substrate 202. The pad layer 204a may be a thin film comprising silicon oxide. The pad layer 204a may be formed by suitable semiconductor fabrication techniques such as a thermal oxidation process. The pad layer 204a may act as an adhesion layer between the semiconductor substrate 202 and mask layer 204b. The pad layer 204a may also act as an etch stop layer for etching the mask layer 204b.

In an embodiment, the mask layer 204b is formed of silicon nitride. The mask layer 204b may be formed by suitable semiconductor fabrication techniques such as low-pressure chemical vapor deposition (LPCVD), plasma enhanced chemical vapor deposition (PECVD) and/or the like.

The mask layer 204b is used as a hard mask during subsequent photolithography processes. A photo-sensitive layer 206 is formed on the mask layer 204b and is then patterned. The patterned photo-sensitive layer forms openings 208 as shown in FIGS. 2A and 2B.

Figure 3A:
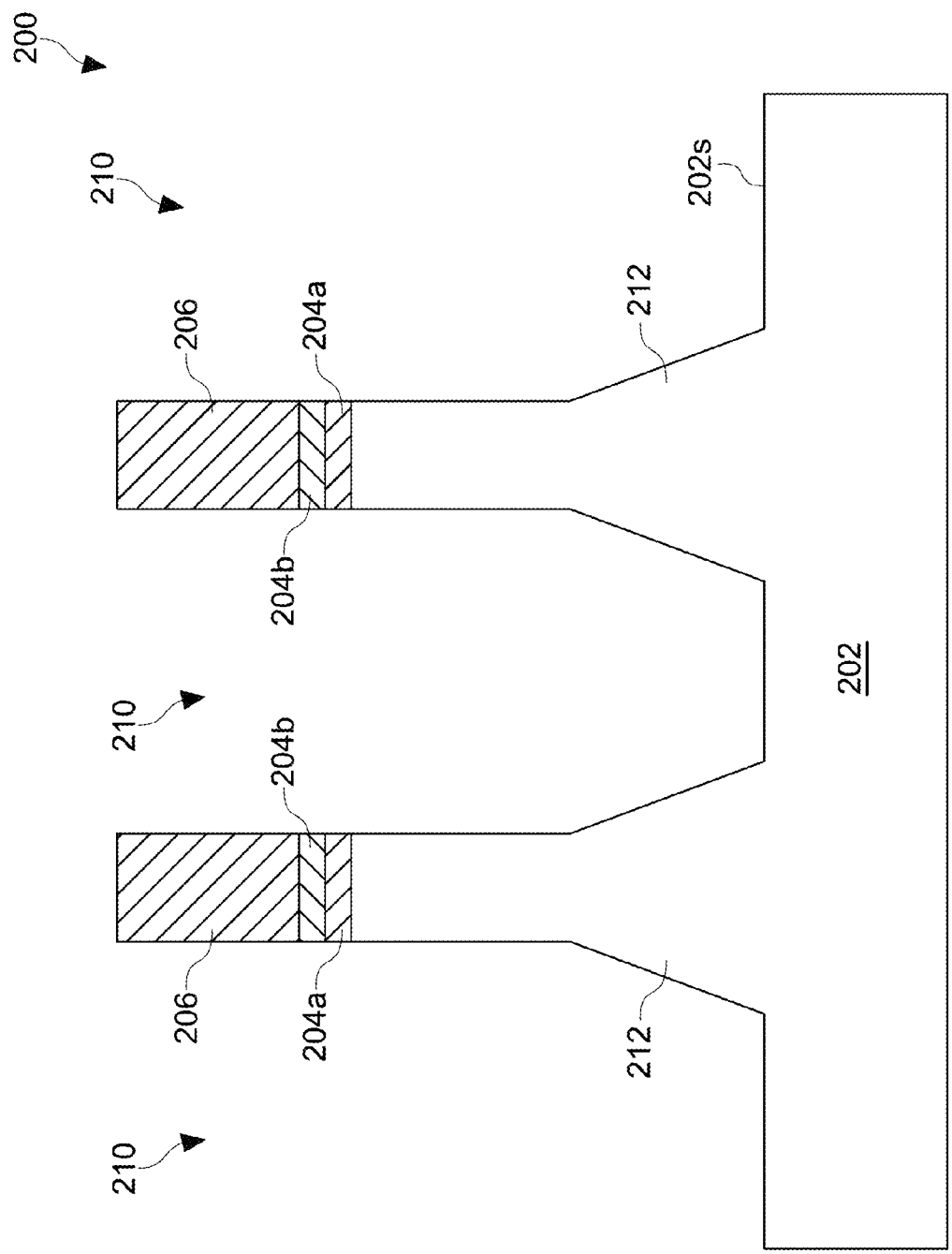
Figure 3B:
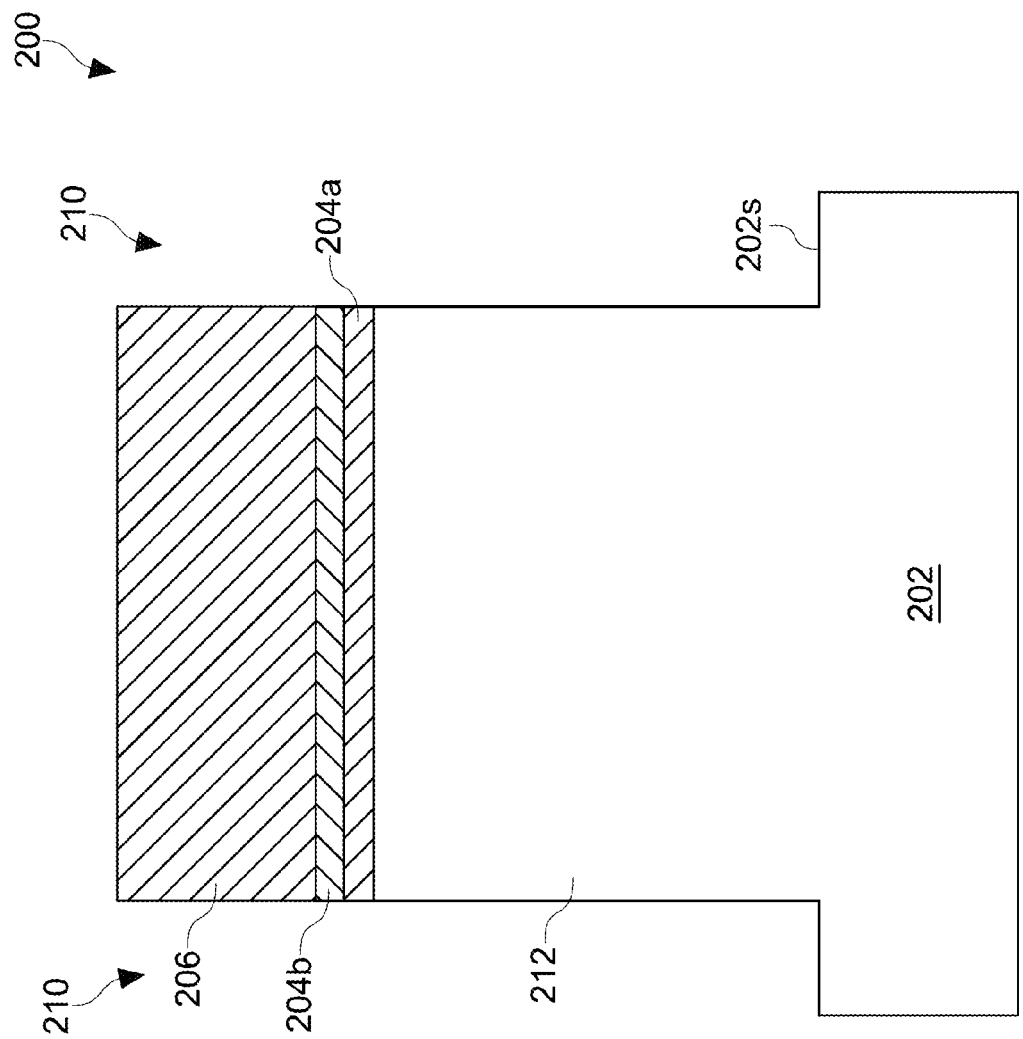

FIGS. 3A and 3B illustrate cross sectional views of the semiconductor device shown in FIGS. 2A and 2B after a plurality of trenches are formed in the substrate in accordance with various aspects of the present disclosure. In some embodiments, the mask layer 204b and pad layer 204a are etched through openings 208 to expose underlying semiconductor substrate 202. The exposed semiconductor substrate 202 is then etched to form trenches 210 with major surfaces 202s of the semiconductor substrate 202. Portions of the semiconductor substrate 202 between trenches 210 form the semiconductor fins 212.

In some embodiments, the trenches 210 may be strips (viewed from the top view of the FinFET 200) parallel to each other, and closely spaced with respect to each other. In alternative embodiments, the trenches 210 may be continuous. Furthermore, the semiconductor fins 212 are surrounded by the trenches 210.

As shown in FIG. 3A, the semiconductor fins 212 protruding from the substrate major surface 202s comprise two fins. The photo-sensitive layer 206 is then removed. Subsequently, a cleaning process may be performed to remove a native oxide (not shown) of the semiconductor substrate 202. The cleaning process may be performed using diluted hydrofluoric (DHF) acid.

Liner oxide (not shown) is then optionally formed in the trenches 210. In some embodiments, liner oxide may be a thermal oxide. The liner oxide may be of a thickness in a range from about 20 Å to about 500 Å.

In some embodiments, liner oxide may be formed by suitable fabrication processes such as in-situ steam generation (ISSG) and/or the like. The formation of liner oxide may round the corners of the trenches 210. One advantageous feature of having round corners is that the round corners may help to reduce the electrical fields, thereby improving the performance of the resulting integrated circuit.

FIGS. 4A and 4B illustrate cross sectional views of the semiconductor device shown in FIGS. 3A and 3B after a plurality of isolation regions are formed in the substrate in accordance with various aspects of the present disclosure. In some embodiments, the trenches 210 are filled with the dielectric material 214 to form a plurality of isolation regions. The dielectric material 214 may include silicon oxide, and hence is also referred to as oxide 214 in the present disclosure. In some embodiments, other dielectric materials, such as silicon nitride, silicon oxynitride, fluoride-doped silicate glass (FSG), or a low-K dielectric material, may also be used.

In some embodiments, the oxide 214 may be formed using a high-density-plasma (HDP) CVD process, using silane ($SiH_4$) and oxygen ($O_2$) as reacting precursors. In alternative embodiments, the oxide 214 may be formed using a sub-atmospheric CVD (SACVD) process or high aspect-ratio process (HARP), wherein process gases may comprise tetraethylorthosilicate (TEOS) and ozone ($O_3$). In yet other embodiments, the oxide 214 may be formed using a spin-on-dielectric (SOD) process, such as hydrogen silsesquioxane (HSQ) or methyl silsesquioxane (MSQ).

The mask layer 204b and the pad layer 204a may be removed. In some embodiments, the mask layer 204b is formed of silicon nitride. The mask layer 204b may be removed using a wet process using hot $H_3PO_4$. The pad layer 204a may be formed of silicon oxide. The pad layer 204a may be removed using diluted HF acid. A chemical mechanical polish (CMP) process is then performed to form the STI regions 216.

Figure 5A:
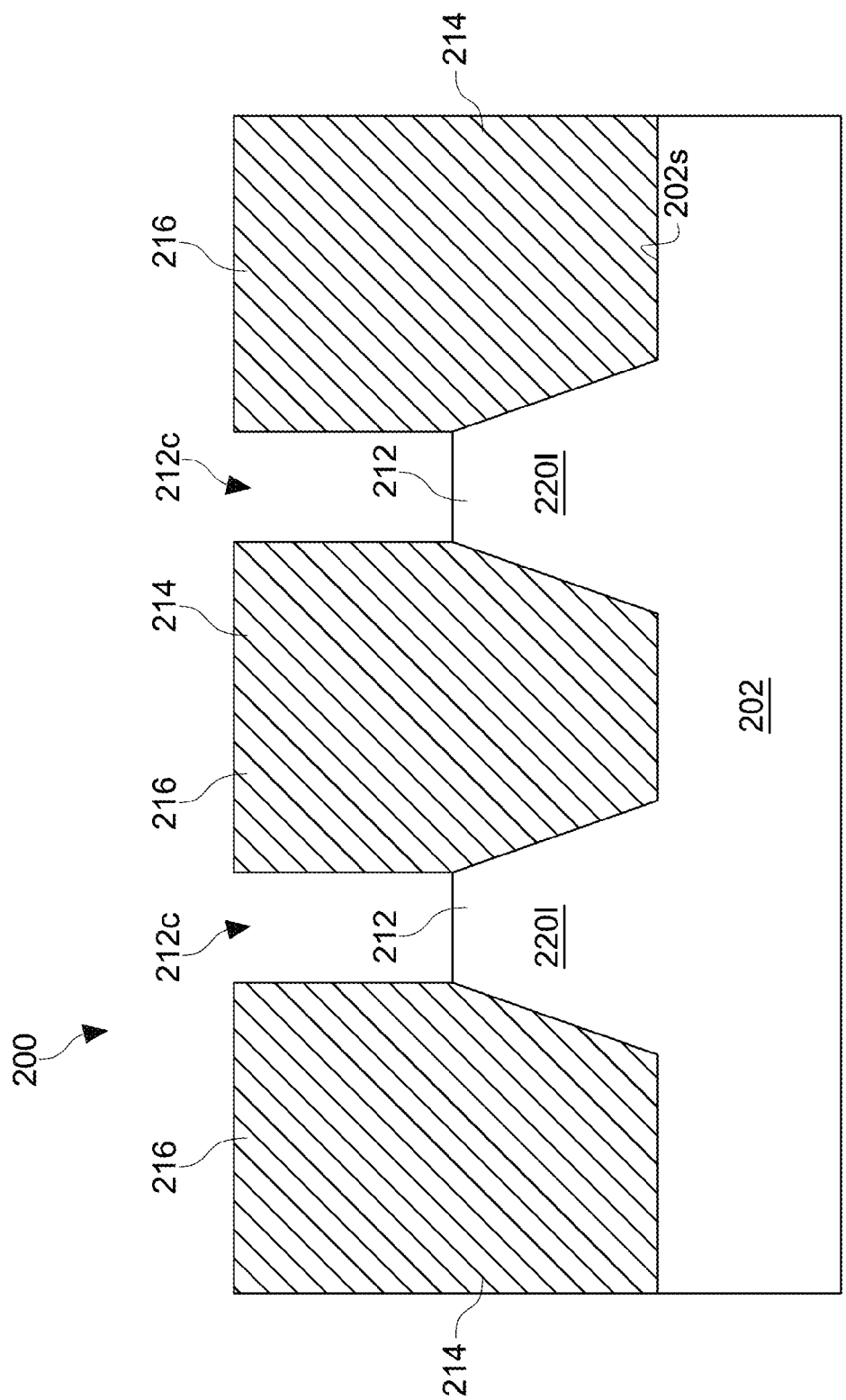

FIGS. 5A and 5B illustrate cross sectional views of the semiconductor device shown in FIGS. 4A and 4B after the upper portions of the semiconductor fins are removed in accordance with various aspects of the present disclosure. Using the STI regions 216 as a hard mask, an anisotropic plasma etching process is performed to recess semiconductor fins 212 that are unprotected or exposed to form the channel cavities 212c between the neighboring STI regions 216 (shown in FIGS. 5A and 5B).

The remaining portions of the semiconductor fins 212 between the neighboring STI regions 216 are hereinafter referred to as a lower portion 220l of the fin structure 220. A shown in FIG. 5A, the lower portion 220l is protruding over the major surface 202s of the substrate 202.

In some embodiments, the lower portion 220l may include the first semiconductor material 202 having the first lattice constant. In some embodiments, the first semiconductor material 202 comprises silicon. In alternative embodiments, the first semiconductor material may be III-V semiconductor materials.

Figure 6A:
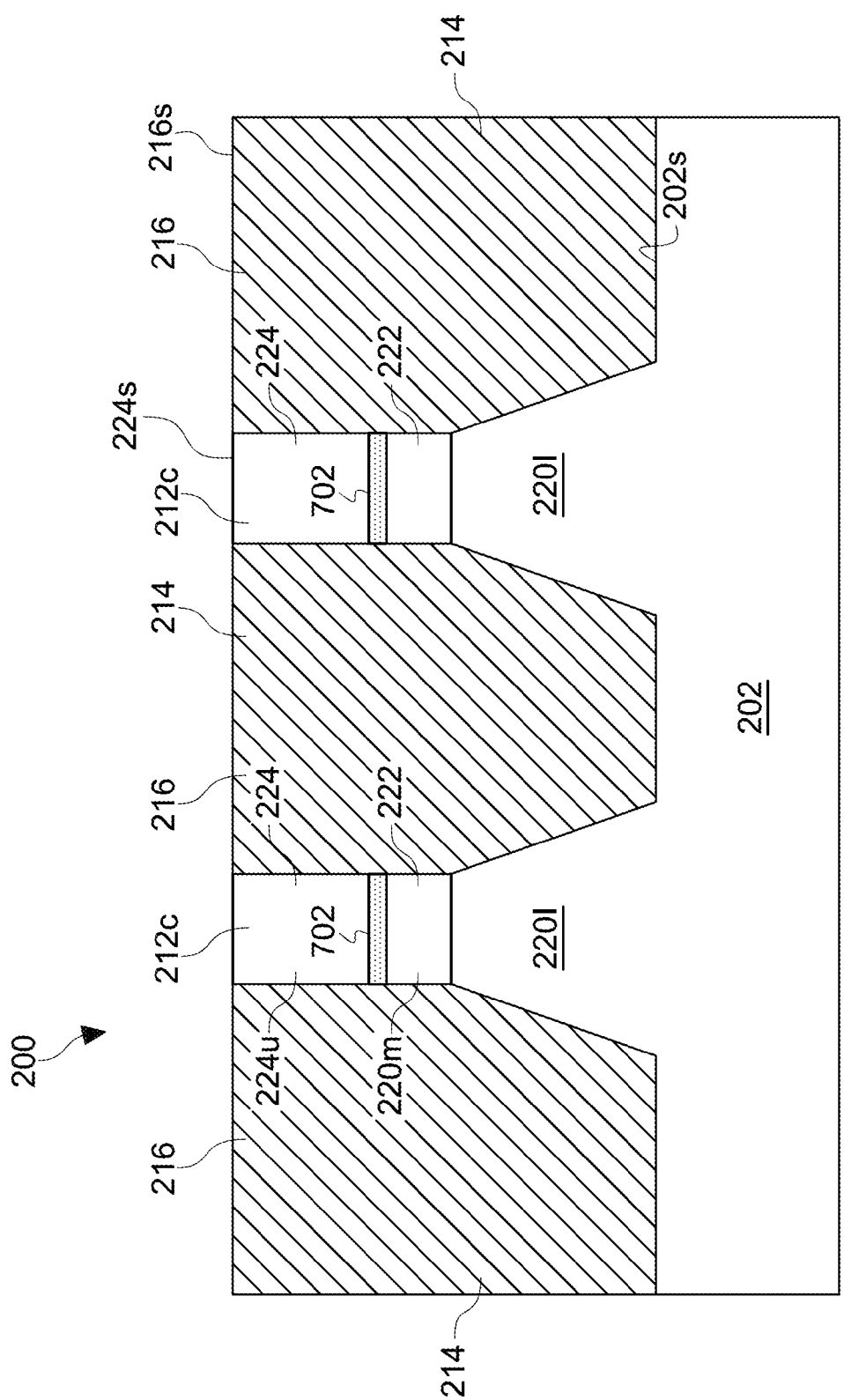

FIGS. 6A and 6B illustrate cross sectional views of the semiconductor device shown in FIGS. 5A and 5B after a plurality of semiconductor materials are grown in the trenches in accordance with various aspects of the present disclosure. A second semiconductor material 222 is selectively grown in the trenches. As a result, the channel cavities 212c are partially filled with the second semiconductor material 222. Throughout the description, the second semiconductor material 222 is hereinafter referred to as a middle portion 220m of the fin structure 220.

The second semiconductor material 222 has a second lattice constant different from the first lattice constant. In some embodiments, the second semiconductor material 222 comprises silicon-germanium (SiGe). In some embodiments, the second semiconductor material 222 such as SiGe is selectively grown by an LPCVD process to partially fill the channel cavities 212c. During the EPI growth process of the second semiconductor material 222, carbon may be in-situ doped with the EPI growth process. As a result, the middle portion 220m may comprise silicon-germanium-carbon (SiGeC). Throughout the description, the middle portion 220m may be referred to as an SiGeC layer.

In one embodiment, the LPCVD process is performed at a temperature of about 400 to about 800° C. and under a pressure of about 1 to about 200 Torr, using $SiH_2Cl_2$, $SiH_4$, $GeH_4$, HCl, $B_2H_6$, and $H_2$ as reaction gases.

In some embodiments, the second semiconductor material 222 may comprise germanium (Ge). The second semiconductor material 222 such as Ge is selectively grown by an LPCVD process to partially fill the channel cavities 212c.

In some embodiments, the LPCVD process is performed at a temperature of about 350° C. to 450° C. and under a pressure of about 10 mTorr to 100 mTorr, using $GeH_4$, $GeH_3CH_3$, and/or $(GeH_3)_2CH_2$ as epitaxial gases. Optionally, an anneal process after the growing process is performed at a temperature of about 550° C. to 750° C. to confine dislocation defects on the interface of the Si and Ge epitaxial layer.

A silicon carbon (SiC) layer 702 may be formed over the SiGeC layer through an epitaxial growth process. The SiC layer 702 may be formed through an LPCVD process. The thickness of the SiC layer 702 is in a range from about 5 nm to about 15 nm. The atomic percentage of carbon is in a range from about 0.5% to about 2%.

A third semiconductor material 224 is selectively grown over the SiC layer 702 and the third semiconductor material 224 is filled in the channel cavities 212c. In some embodiments, the third semiconductor material 224 is substantially the same material as the first semiconductor material 202 having the first lattice constant.

In some embodiments, the third semiconductor material 224 comprises silicon. In some embodiments, the third semiconductor material 224 such as silicon is selectively grown by an LPCVD process to fill the channel cavities 212c. In some embodiments, the LPCVD process is performed at a temperature of about 400 to 800° C. and under a pressure of about 1 to 100 Torr, using $SiH_4$, and $H_2$ as reaction gases.

After the growing, a planarization such as a CMP is performed, so that a top surface 224s of the third semiconductor material 224 is substantially level with a top surface 216s of the STI regions 216.

As shown in FIG. 6A, the third semiconductor material 224 forms upper portions 220u of the fin structure 220. Further, the fin structure 220 comprises the lower portion 2201, upper portion 220u, and middle portion 220m between the lower portion 2201 and upper portion 220u. The SiC layer 702 is formed between the middle portions 220m and the upper portions 220u.

Figure 7A:
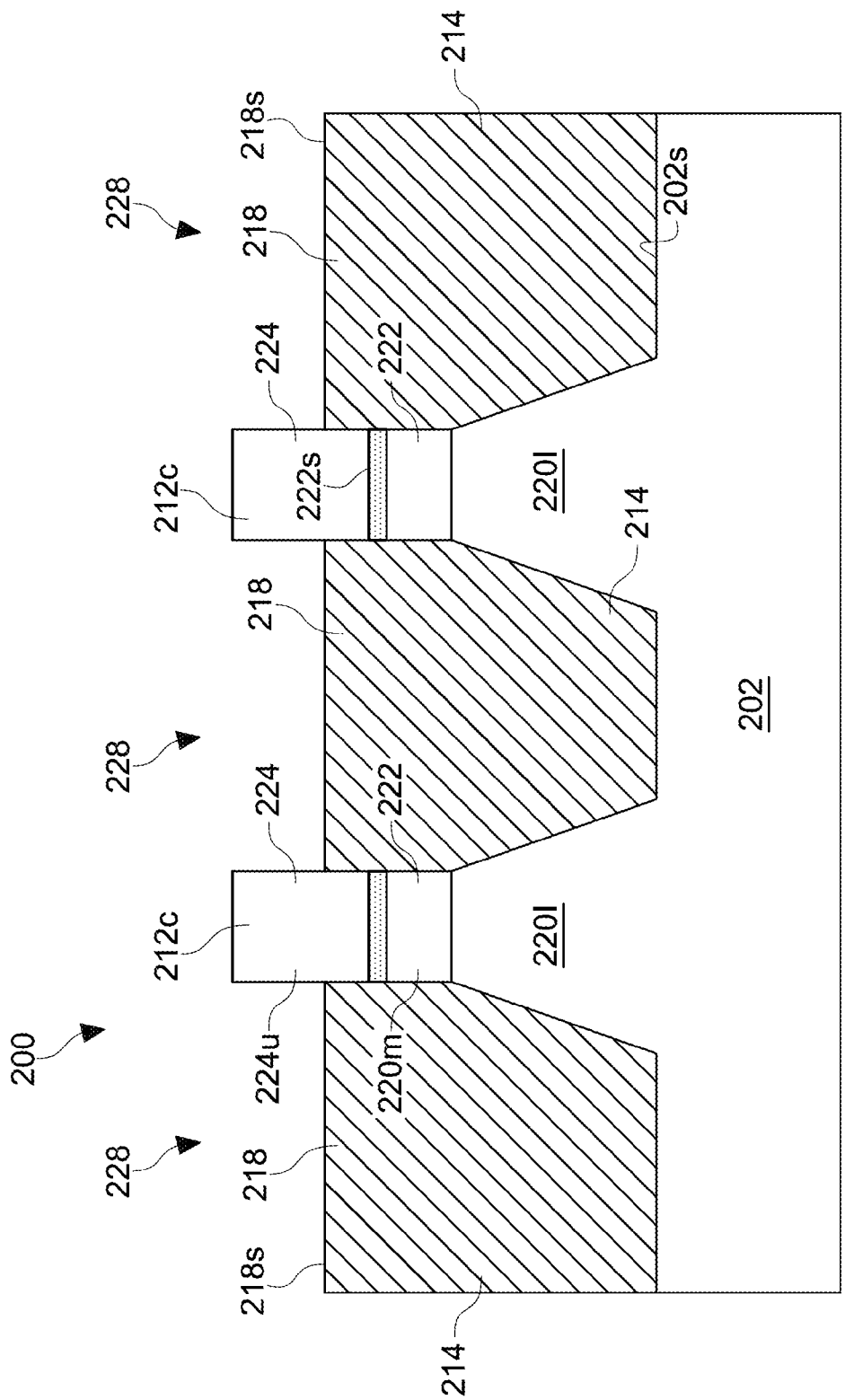
Figure 7B:
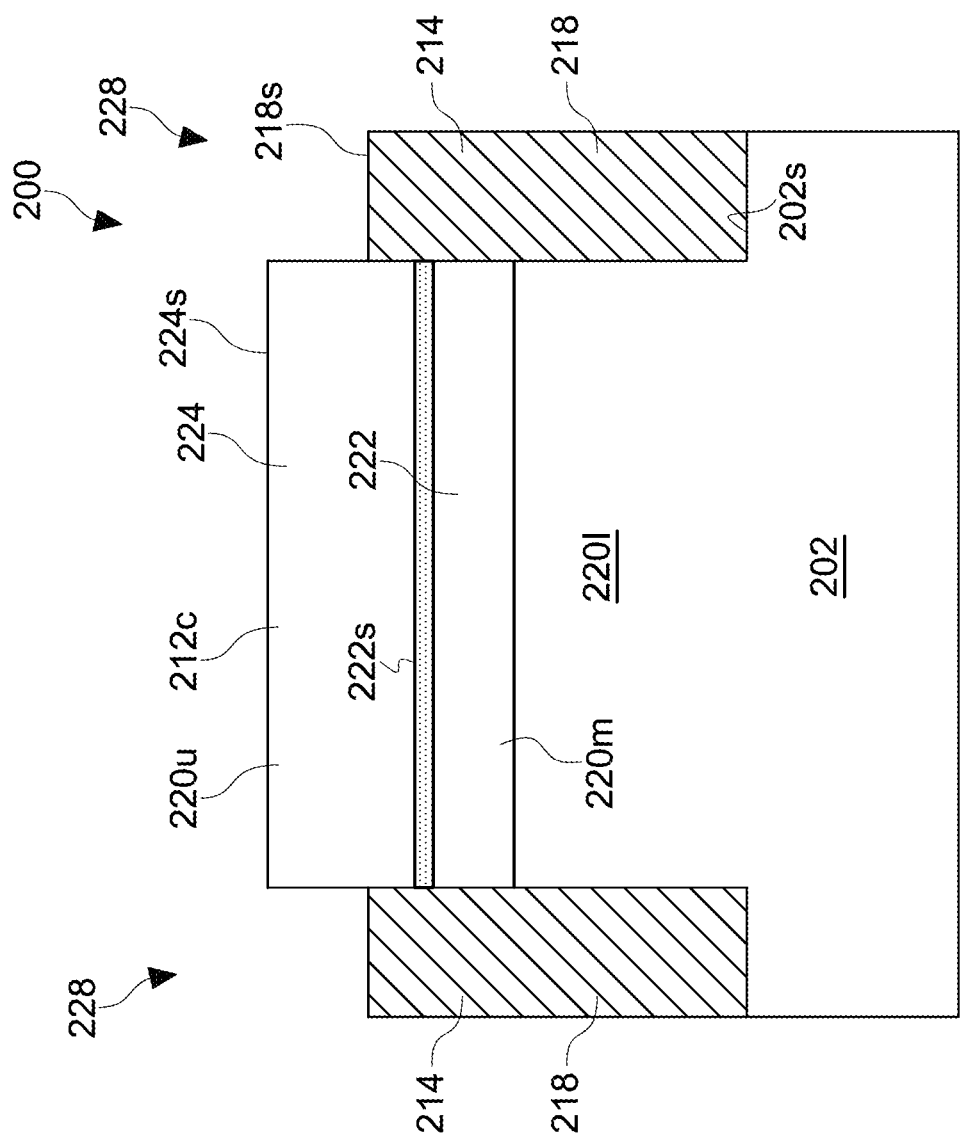

FIGS. 7A and 7B illustrate cross sectional views of the semiconductor device shown in FIGS. 6A and 6B after a recessing process is applied to the isolation regions in accordance with various aspects of the present disclosure. The STI regions 216 are recessed by an etching process to expose a portion of the upper portion 220u. As shown in FIG. 7A, recesses 228 are formed. The remaining oxide 214 surrounding the fin structure 220 is hereinafter referred to as an isolation structure 218. A shown in FIG. 7A, a top surface 218s of the isolation structure 218 is higher than a top surface 222s of the second semiconductor material 222.

In some embodiments, the etching process may be performed using a wet etching process, for example, by dipping the substrate 202 in hydrofluoric acid (HF). In some embodiments, the etching step may be performed using a dry etching process, for example, the dry etching process may be performed using $CHF_3$ or $BF_3$ as etching gases.

Figure 8A:
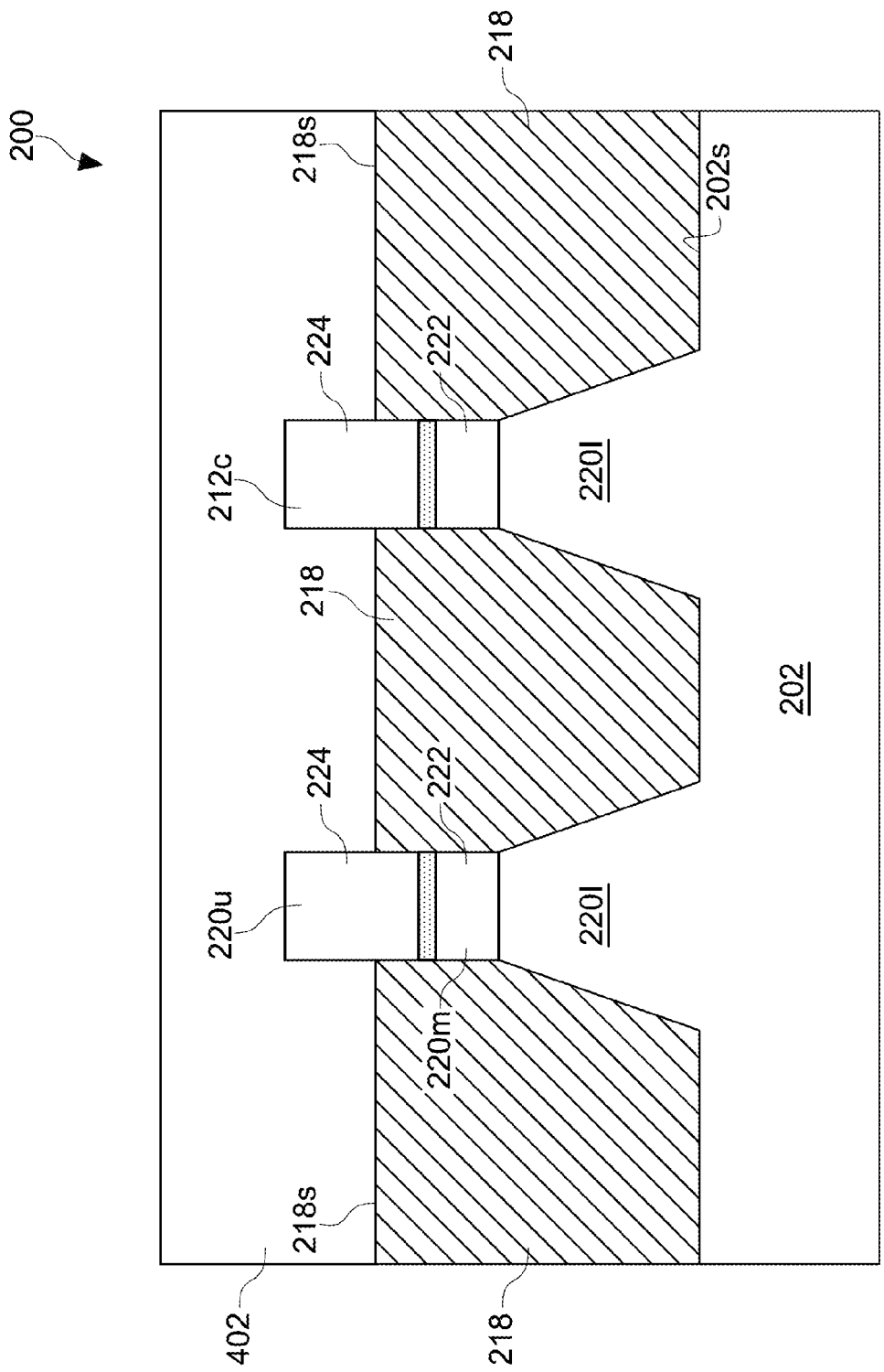
Figure 8B:
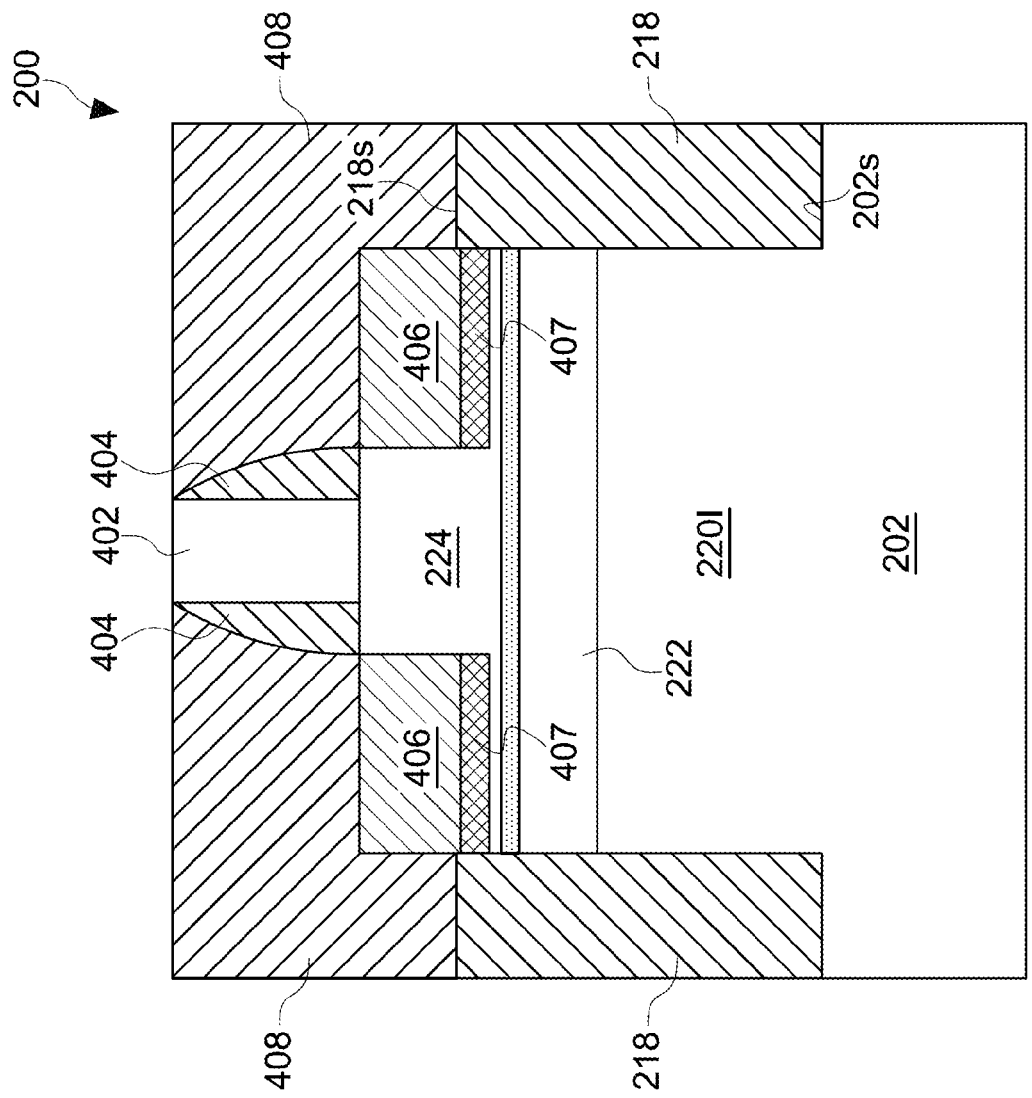

FIGS. 8A and 8B illustrate cross sectional views of the semiconductor device shown in FIGS. 7A and 7B after source/drain regions are formed in the semiconductor device in accordance with various aspects of the present disclosure. The structures shown in FIGS. 8A and 8B are the structures of FIGS. 7A and 7B after subsequent fabrication processes of the embodiment comprising (1) forming a dummy gate stack 402 and a pair of spacer 404 on channel portion of the upper portion 220u, (2) replacing outer portions of the upper portion 220u with SiC layers 407 and source/drain regions 406, and (3) forming an inter-layer dielectric (ILD) layer 408 surrounding the dummy gate stack 402. The formation processes of the dummy gate stack 402, the spacer 404 and the ILD layer 408 are well known, hence are not discussed in further detail to avoid repetition.

Prior to forming the source/drain regions 406, the SiC layers 407 may be formed through an epitaxial growth process such as an LPCVD process. As shown in FIG. 8B, the SiC layers 407 are formed over the third semiconductor material 224. There may be a gap between the SiC layers 407 and the SiGeC layer 222. In some embodiments, the SiC layers 407 are of a thickness in a range from about 5 nm to about 15 nm. The atomic percentage of carbon is in a range from about 0.5% to about 2%.

In alternative embodiments, the SiC layers 407 may further comprise phosphorus. The SiC layers 407 may be alternatively referred to as the SiCP layers 407. The concentration of phosphorus is in a range from about 1E20/cm3 to about 5E20/cm3.

The source/drain regions 406 may be formed over the SiC layers 407. In some embodiments, the source/drain region 406 may be formed through one or more epitaxial growth processes. In some embodiments, the semiconductor material grown in the epitaxial growth processes may be silicon or other suitable materials such as Ge and/or the like.

The source/drain regions 406 may be in-situ doped during the epitaxial growth processes. In some embodiments, the source/drain regions 406 may be doped with phosphorus to form SiP source/drain regions. The thickness of the source/drain regions 406 is in a range from about 30 nm to about 50 nm.

The diffusion of the n-type dopants such as phosphorus may be enhanced in an SiGe region. Such an enhanced diffusion process of the n-type dopants may degrade the performance of the semiconductor device such as short channel effects. One advantageous feature of having the SiC layers 407 is that the SiC layers 407 may function as a wall to prevent phosphorus from diffusing into the SiGe regions such as the SiGeC region 222. As a result, the short channel effect caused by enhance phosphorus diffusion may be avoided.

Figure 9:
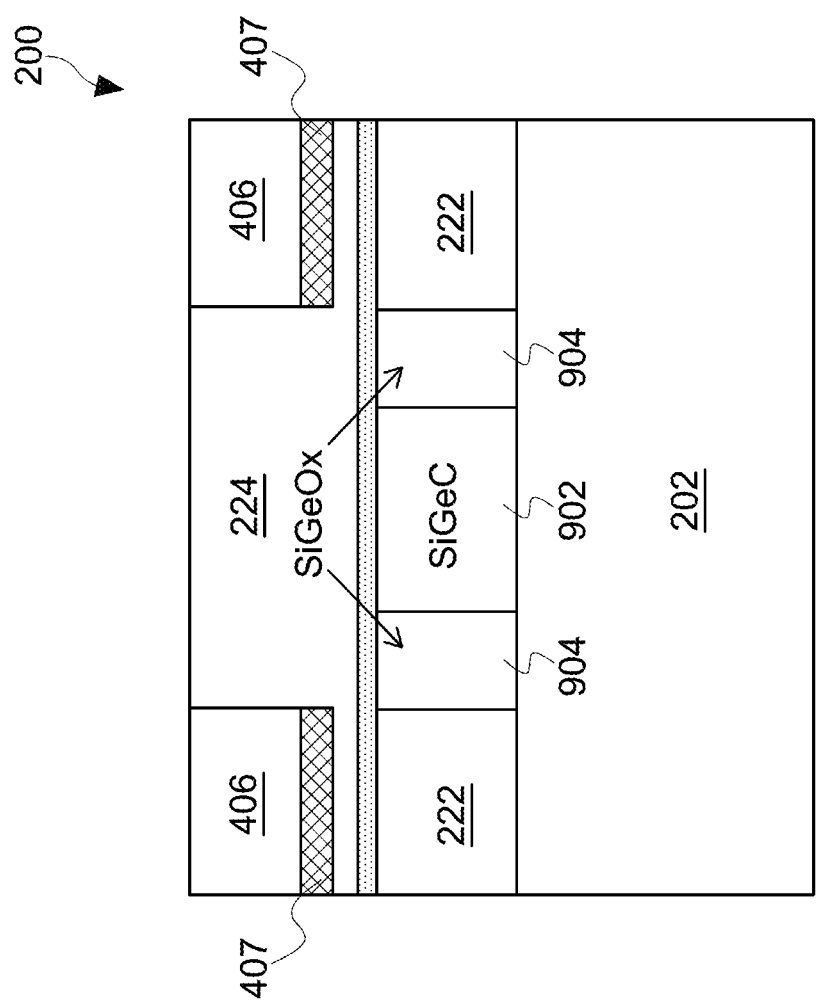
FIG. 9 illustrates a cross sectional view of a portion of the semiconductor device shown in FIG. 8B after a first oxidation process is applied to the semiconductor device in accordance with various aspects of the present disclosure.
Figure 10:
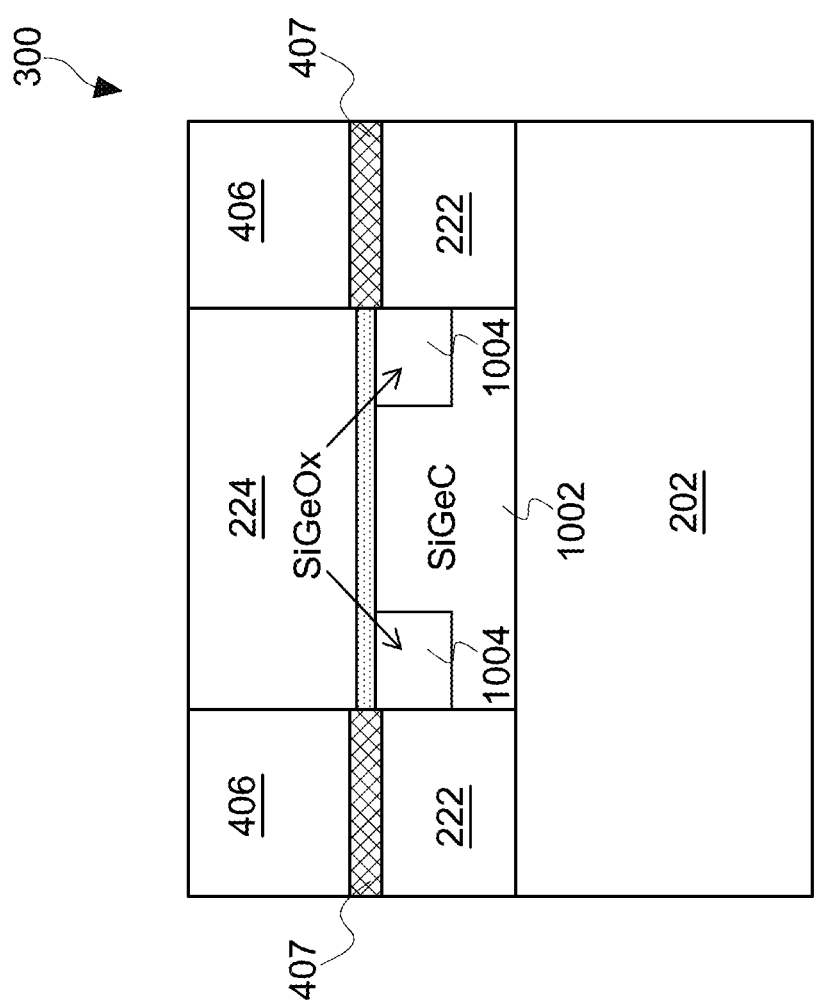
FIG. 10 illustrates a cross sectional view of a semiconductor device in accordance with various aspects of the present disclosure.

FIG. 9 illustrates a cross sectional view of a portion of the semiconductor device shown in FIG. 8B after a first oxidation process is applied to the semiconductor device in accordance with various aspects of the present disclosure. As shown in FIG. 10, for fabricating an oxide outer layer in the semiconductor device 100, after removing the dummy gate stack 402 to expose channel portion of the upper portion 220u, the oxide outer layer 904 in FIG. 10 is produced by performing the first oxidation process to the middle portion of the semiconductor fin to form the oxide outer layer 904 and the remaining SiGeC portion 902.

In some embodiments, the step of the first oxidation process is performed at a temperature of about 500° C. to about 600° C. and under a pressure of about 1 atm to about 20 atm, using $H_2O$ as a reaction gas. As a result of the oxidation, the oxide outer layer 904 comprises $SiGeO_x$, wherein x is oxygen composition in atomic percentage.

It should be noted that the method shown in FIGS. 2A-9 does not produce a completed FinFET 200. A completed FinFET 200 may be fabricated using complementary metal-oxide-semiconductor (CMOS) technology processing. Accordingly, it is understood that additional processes may be provided before, during, and after the method, and that some other processes may only be briefly described herein. Also, FIGS. 1 through 9 are simplified for a better understanding of the concepts of the present disclosure. For example, although the figures illustrate the FinFET 200, it is understood the IC may comprise a number of other devices comprising resistors, capacitors, inductors, fuses, etc.

FIG. 10 illustrates a cross sectional view of a semiconductor device in accordance with various aspects of the present disclosure. The semiconductor device 300 shown in FIG. 10 is similar to the semiconductor device 200 shown in FIG. 9 except that the SiC layers 407 are formed in the SiGeC layer 222 and the semiconductor device 300 undergoes an oxidation process in which the SiGe regions of the semiconductor device 300 are exposed. The oxidation process with the exposed SiGe regions has been described in related applications (U.S. patent application Ser. No. 13/740,373 and application Ser. No. 13/902,322), and hence is not discussed herein to avoid repetition.

One advantageous feature of having the SiC layers 407 formed in the SiGeC layer 222 is the resistance of the source/drain regions may be reduced accordingly.

Figure 11:
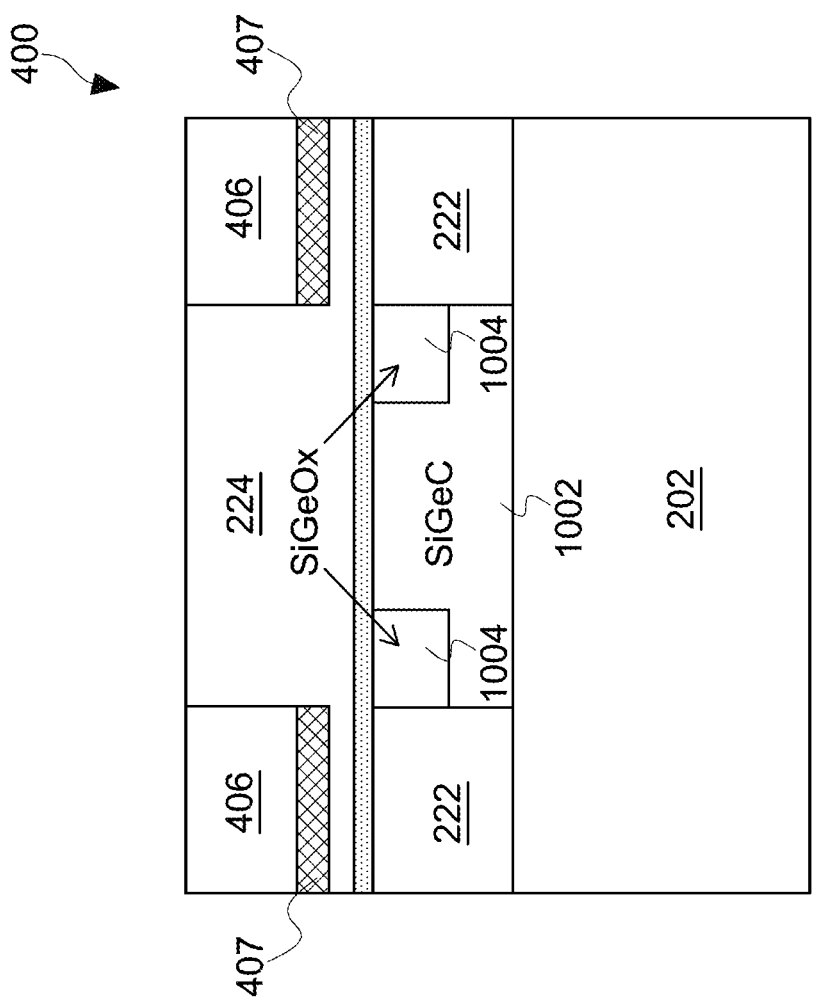
FIG. 11 illustrates a cross sectional view of another semiconductor device in accordance with various aspects of the present disclosure.

FIG. 11 illustrates a cross sectional view of another semiconductor device in accordance with various aspects of the present disclosure. The semiconductor device 400 shown in FIG. 11 is similar to the semiconductor device 300 shown in FIG. 10 except that the SiC layers 407 shown in FIG. 11 are formed over the third semiconductor material 224 rather than the SiGeC layer 222. The formation process has been described above with respect to FIG. 8B, and hence is not discussed again herein to avoid repetition.

In accordance with an embodiment, an apparatus comprises a substrate formed of a first semiconductor material, a fin structure protruding over the substrate, wherein the fin structure comprises a lower portion formed of the first semiconductor material, a middle portion formed of a second semiconductor material, an upper portion formed of the first semiconductor material, wherein the upper portion comprises a channel connected between a first source/drain region and a second source/drain region and a first carbon doped layer formed between the middle portion and the upper portion, a second carbon doped layer formed underlying the first source/drain region and a third carbon doped layer formed underlying the second source/drain region.

In accordance with an embodiment, a device comprises a substrate comprising silicon, a fin structure protruding over the substrate, wherein the fin structure comprises a lower portion formed of silicon and enclosed by an isolation region, a middle portion formed of silicon-germanium-carbon, wherein the middle portion is enclosed by an oxide layer, an upper portion formed of silicon, wherein the upper portion comprises a channel and a silicon-carbon layer formed between the middle portion and the upper portion, a first source/drain region comprising a first silicon-phosphorus region and a first silicon-carbon layer formed underlying the first silicon-phosphorus region and a second source/drain region comprising a second silicon-phosphorus region and a second silicon-carbon layer formed underlying the second silicon-phosphorus region.

In accordance with an embodiment, a method comprises providing a substrate formed of a first semiconductor material, recessing the substrate to form a fin enclosed by an isolation region, recessing the fin to form a trench over a lower portion of the fin, growing a second semiconductor material in the trench to form a middle portion of the fin through a first epitaxial process, forming a first carbon doped layer over the lower portion through a second epitaxial process, growing the first semiconductor material over the carbon doped layer to form an upper portion of the fin through a third epitaxial process, forming a first source/drain region through a fourth epitaxial process, wherein a second carbon doped layer is formed underlying the first source/drain region and applying a thermal oxidation process to the middle portion of the fin to form an oxide outer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   a substrate formed of a first semiconductor material;
   a fin structure protruding over the substrate, wherein the fin structure comprises:
      a lower portion formed of the first semiconductor material;
      a middle portion formed of a second semiconductor material;
      an upper portion formed of the first semiconductor material, wherein the upper portion comprises a channel connected between a first source/drain region and a second source/drain region; and
      a first carbon doped layer formed between the middle portion and the upper portion;
   a second carbon doped layer formed underlying the first source/drain region; and
   a third carbon doped layer formed underlying the second source/drain region.

2. The apparatus of claim 1, further comprising:
   a gate region wrapping the channel of the fin structure.

3. The apparatus of claim 1, wherein:
the first semiconductor material is silicon; and
the second semiconductor material is silicon-germanium-carbon (SiGeC).

4. The apparatus of claim 1, wherein:
the first carbon doped layer is formed of silicon-carbon (SiC);
the second carbon doped layer is formed of SiC; and
the third carbon doped layer is formed of SiC.

5. The apparatus of claim 1, wherein:
the second carbon doped layer is formed of silicon-carbon-phosphorus (SiCP); and
the third carbon doped layer is formed of SiCP.

6. The apparatus of claim 1, wherein:
the first source/drain region is formed of silicon-phosphorus (SiP); and
the second source/drain region is formed of SiP.

7. The apparatus of claim 1, wherein:
the middle portion of the fin structure comprises an oxide outer layer, and wherein the oxide outer layer is formed of SiGeOx, and wherein x is oxygen composition in atomic percentage.

8. A device comprising:
a substrate comprising silicon;
a fin structure protruding over the substrate, wherein the fin structure comprises:
a lower portion formed of silicon and enclosed by an isolation region;
a middle portion formed of silicon-germanium-carbon, wherein the middle portion is enclosed by an oxide layer;
an upper portion formed of silicon, wherein the upper portion comprises a channel; and
a silicon-carbon layer formed between the middle portion and the upper portion;
a first source/drain region comprising a first silicon-phosphorus region and a first silicon-carbon layer formed underlying the first silicon-phosphorus region; and
a second source/drain region comprising a second silicon-phosphorus region and a second silicon-carbon layer formed underlying the second silicon-phosphorus region.

9. The device of claim 8, wherein:
the first source/drain region is of a thickness in a range from about 30 nm to about 50 nm; and
the second source/drain region is of a thickness in a range from about 30 nm to about 50 nm.

10. The device of claim 8, wherein:
the oxide layer comprises SiGeOx, and wherein x is oxygen composition in atomic percentage.

11. The device of claim 8, wherein:
the silicon-carbon layer is of a thickness in a range from about 5 nm to about 15 nm.

12. The device of claim 11, wherein:
a carbon concentration of the silicon-carbon layer is from about 0.5% to about 2% in atomic percentage.

13. The device of claim 8, wherein:
a germanium concentration of the middle portion is from about 20% to about 45%; and
a carbon concentration of the middle portion is from about 0.5% to about 2%.

14. The device of claim 8, wherein:
the silicon-carbon layer further comprises phosphorus.

15. The device of claim 14, wherein:
a phosphorus concentration is in a range from about 1E20/cm3 to about 5E20/cm3.

16. A device comprising:
a fin structure over a silicon substrate, wherein the fin structure comprises:
a lower portion formed of silicon;
a middle portion formed of silicon-germanium-carbon;
an upper portion formed of silicon; and
a silicon-carbon layer formed between the middle portion and the upper portion;
a first source/drain region comprising a first silicon-phosphorus region and a first silicon-carbon layer formed underlying the first silicon-phosphorus region; and
a second source/drain region comprising a second silicon-phosphorus region and a second silicon-carbon layer formed underlying the second silicon-phosphorus region.

17. The device of claim 16, wherein:
a first gap is between a bottom surface of the first silicon-carbon layer and a top surface of the silicon-carbon layer; and
a second gap is between a bottom surface of the second silicon-carbon layer and the top surface of the silicon-carbon layer.

18. The device of claim 17, wherein:
a height of the first gap is equal to a height of the second gap.

19. The device of claim 16, wherein:
the lower portion is enclosed by an isolation region.

20. The device of claim 16, wherein:
the upper portion comprises a channel connected between the first source/drain region and the second source/drain region.

* * * * *